United States Patent [19]

Horiuchi et al.

[11] 3,942,125
[45] Mar. 2, 1976

[54] DIGITAL REPETITION RATE CHECK CIRCUIT

[75] Inventors: Edward M. Horiuchi, Skokie; Jose V. Souto Martins, Arlington Heights, both of Ill.

[73] Assignee: GTE Automatic Electric Laboratories Incorporated, Northlake, Ill.

[22] Filed: Jan. 8, 1975

[21] Appl. No.: 539,481

[52] U.S. Cl. ............... 328/141; 328/110; 328/119; 307/217
[51] Int. Cl.[2] .......................................... H03B 3/04
[58] Field of Search ........... 328/133, 134, 140, 141, 328/119, 110; 307/217

[56] References Cited
UNITED STATES PATENTS

| | | | |
|---|---|---|---|
| 3,314,014 | 4/1967 | Perkins | 328/141 X |
| 3,588,710 | 6/1971 | Masters | 328/133 |
| 3,601,706 | 8/1971 | Battle | 328/119 |
| 3,706,935 | 12/1972 | Hughes | 328/141 X |

*Primary Examiner*—John S. Heyman

[57] ABSTRACT

A pulse repetition rate check circuit of the type which detects when the second of two consecutive pulses from a pulse generator is early or late with respect to a predetermined repetition time period includes an early pulse detector, first and second early pulse detector enabling means and first and second clocks. Each early pulse detector enabling means enables the early pulse detector responsive to its associated clock for a predetermined time so that a second pulse occurring within the predetermined time is detected as an early second pulse. The early pulse detector enabling means includes an inhibit means for preventing the enabling of the early pulse detector after it has been once enabled. A steering circuit alternately directs the clocking signals from an oscillator to the clocks responsive to alternate pulses and a clock reset means associated with each clock causes each clock to be reset responsive to the other clock to assure that one clock is always conditioned to act upon the receipt of the next pulse. The pulse repetition rate check circuit also includes first and second late pulse detectors which are coupled to the first and second clocks respectively for providing an error signal indicating that the second pulse is late should the second pulse fail to occur within the predetermined repetition time period.

10 Claims, 3 Drawing Figures

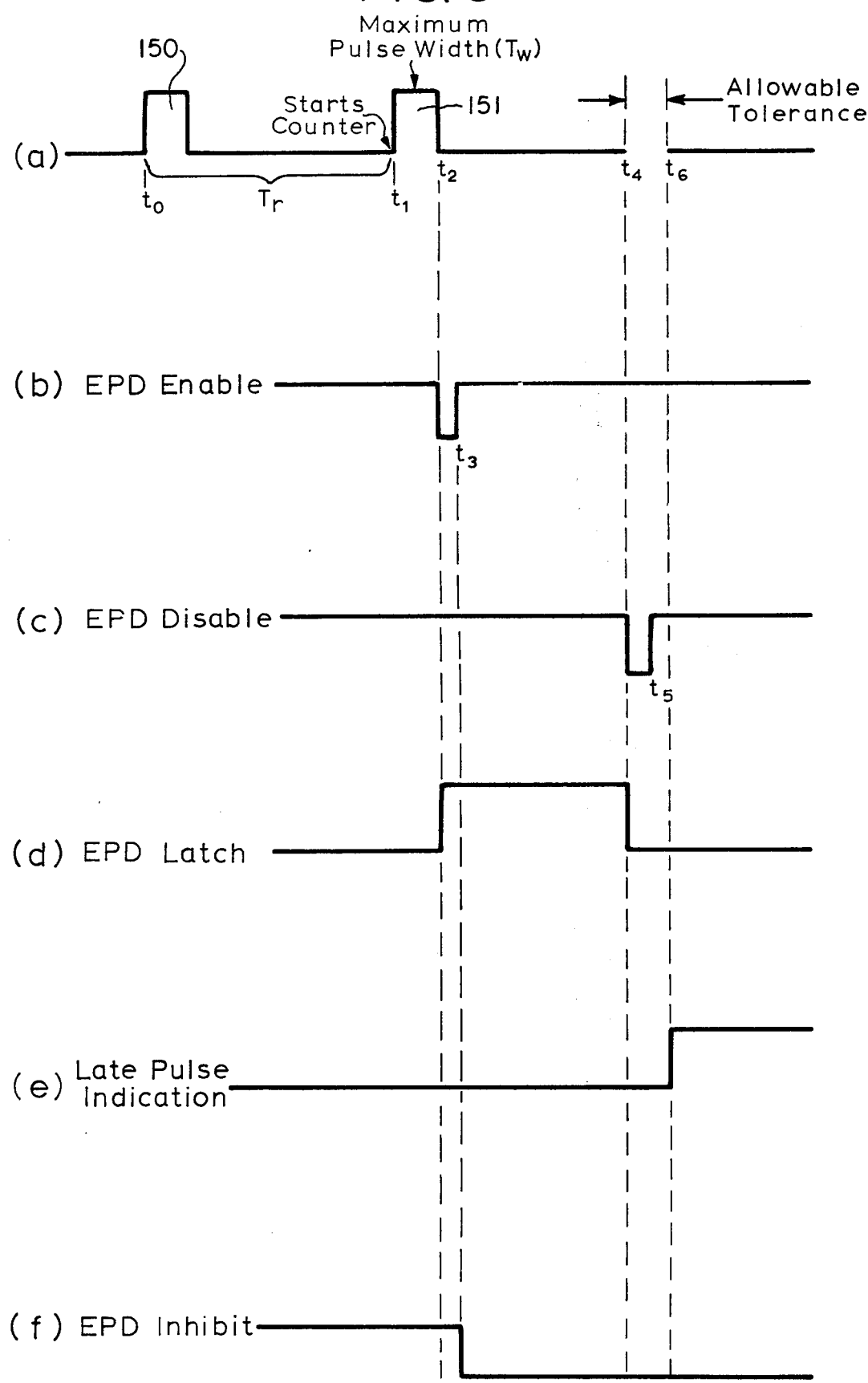

DIGITAL REPETITION RATE CHECK CIRCUIT

BACKGROUND OF THE INVENTION

The present invention is generally directed to a pulse repetition rate check circuit. It is particularly directed to a pulse repetition rate check circuit which provides an error signal in response to the second of two consecutive pulses provided by a pulse generator being early, late or never occurring with respect to a predetermined repetition time period following the first pulse.

There are many applications where precise timing of digital equipment is absolutely essential. Such equipment is usually operatively timed by a chain of timing pulses which must be properly spaced in time to assure correct operation of the equipment. To assure that such equipment is properly timed, pulse repetition rate circuits have been provided for detecting when the timing pulses are not equally spaced to indicate improper operation of the digital equipment.

Prior art pulse repetition check circuits have included circuits which provide an average repetition rate, that is to say, the timing pulses are counted for a preset time period and an average repetition rate calculated. Obviously, such circuits are inadequate when the repetition rate of the timing pulses must remain constant from one pulse to the next.

Circuits to monitor the repetition rate of a train of timing pulses on a pulse to pulse basis usually include a counter which is responsive to the first of two consecutive pulses for timing the occurrence of the second pulse. Unfortunately, such circuits have experienced difficulty in resetting the counter to accommodate the next pulse in the train where the timing pulses occur at a relatively high repetition rate. It is possible that a pulse may be missed if it occurs within the time required to reset the counter.

Among other functions the counters are generally used for the enabling of an early pulse detector during a predetermined time so that a second pulse occurring within that predetermined time may be detected as an early pulse. Because the counters are generally driven by a free running oscillator and have a finite capacity, there is a possibility that a late pulse may be detected as an early pulse. This could happen, for example, if the second pulse occurs after the counter has counted to capacity and back to zero.

It is therefore a general object of the present invention to provide an improved pulse repetition rate check circuit.

It is a further object of the present invention to provide a pulse repetition rate check circuit which provides an error indication when the second of two consecutive pulses is early, late or never occurs with respect to a predetermined repetition time period which is spaced apart in time by a predetermined time from the first pulse.

It is a still further object of the present invention to provide a pulse repetition rate check circuit which monitors the repetition rate of the pulses generated by a pulse generator on a pulse to pulse basis.

It is a still more particular object of the present invention to provide a pulse repetition rate check circuit which is always ready to accommodate each pulse of a pulse train regardless of the repetition rate of the pulse train.

It is a still further more particular object of the present invention to provide a pulse repetition rate check circuit which includes an early pulse detector which is enabled for a predetermined time so that a second pulse occurring within the predetermined time is detected as an early pulse and wherein the early pulse detector is prevented from being enabled after it has been once enabled to thereby prevent a late pulse from being detected as an early pulse.

SUMMARY OF THE INVENTION

The present invention provides a pulse repetition rate check circuit of the type which detects when the second of two consecutive pulses from a pulse generator is early or late with respect to a predetermined repetition time period following the first pulse. The pulse repetition rate check circuit of the present invention comprises an input for receiving the consecutive pulses, a clock coupled to the input and activated responsive to the receipt of the first pulse and having a finite capacity before returning to zero time, an early pulse detector coupled to the input for detecting the second pulse, and an early pulse detector enabling means coupled to the clock and to the detector for enabling the detector for a predetermined time and including an inhibit means for preventing the detector from being enabled after the detector has been once enabled. The inhibit means therefore will preclude the detector from once again being enabled notwithstanding a second pulse being received so late as to allow the clock to time up to capacity and back to zero to thereby prevent a late second pulse from being detected as an early pulse.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, and the several figures of which like reference numerals identify like elements, and in which:

FIG. 3 shows graphical representation of waveforms generated within the pulse repetition rate check circuit of FIGS. 1 and 2 which may be utilized to more fully understand the operation of the present invention.

DESCRIPTION OF THE PREFERRED EMBODIMENT

Figure 1:
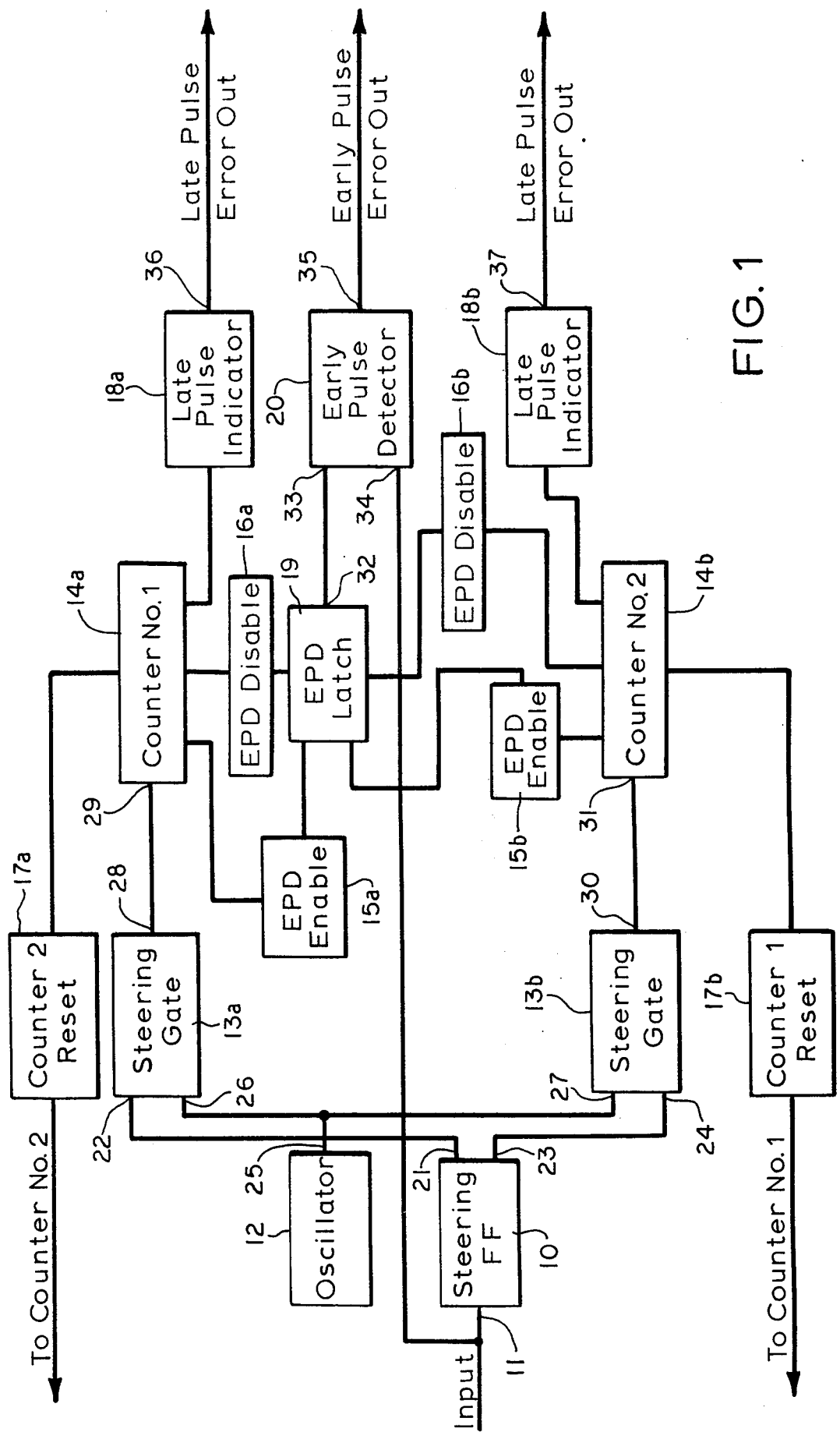
FIG. 1 is a block schematic representation of a pulse repetition rate check circuit embodying the present invention.

Referring now to FIG. 1, the pulse repetition rate check thereshown in block form comprises a steering flip-flop 10 having input 11 connected to the pulse generator which provides the pulses whose repetition rates will be monitored, oscillator 12, first and second steering gates 13a and 13b, first and second counters 14a and 14b, first and second early pulse detector enables 15a and 15b, first and second early pulse detector disables 16a and 16b, first and second counter resets 17a and 17b, and first and second late pulse indicators 18a and 18b. The pulse repetition rate check circuit of FIG. 1 additionally comprises early pulse detector latch 19 and early pulse detector 20.

Steering flip-flop 10 has an output 21 coupled to input 22 of steering gate 13a and output 23 coupled to input 24 of steering gate 13b. Steering flip-flop 10 is of the type wherein one of its outputs is a logical one while the other output is a logical zero. The logic levels at outputs 21 and 23 are caused to reverse upon the receipt of a pulse at input 11. Oscillator 12 has output 25 coupled to input 26 of steering gate 13a and to input 27 of steering gate 13b. Steering gate 13a has an output 28 coupled to the clock input 29 of counter 14a and steering gate 13b has an output 30 coupled to the clock input 31 of counter 14b.

Upon the receipt of each input pulse at input 11, steering flip-flop 10 causes one of the steering gates 13a or 13b to gate the clock pulses provided by oscillator 12 to one of the counters. Thus, each counter is responsive to the receipt of the input pulses at input 11 and is caused to be activated upon the receipt of every other input pulse. The function of counters 14a and 14b within the pulse repetition rate check circuit shown in FIG. 1 is to keep time and therefore, they may be thought of as first and second clocks.

As shown, early pulse detector enable 15a and early pulse detector disable 16a are coupled between counter 14a and the early pulse detector latch 19. In identical manner, early pulse detector enable 15b and early pulse detector disable 16b are coupled between counter 14b and latch 19. Latch 19 has an output 32 coupled to input 33 of early pulse detector 20. Input 34 of the early pulse detector 20 is coupled to input 11. The early pulse detector enables and early pulse detector disables coact with latch 19 to cause early pulse detector 20 to be enabled for a predetermined period of time following the receipt of a first pulse at input 11. The predetermined period of time in which the early pulse detector 20 is enabled begins when the first pulse has passed and terminates when the next or second pulse should arrive if on time relative to the first pulse. Should the second pulse arrive during the predetermined time in which the early pulse detector is enabled, early pulse detector 20 will provide at its output 35 a pulse indicating that the second pulse arrived early.

The early pulse detector enables 15a and 15b are responsive to their respective counters 14a and 14b to set latch 19 when the predetermined period of time is to begin to thus enable the early pulse detector 20. The early pulse detector disables 16a and 16b are responsive to their respective counters 14a and 14b to reset latch 19 when the predetermined period of time is to begin to thus enable the early pulse detector 20. The early pulse detector disables 16a and 16b are responsive to their respective counters 14a and 14b to reset latch 19 when the predetermined period of time is to end. In this way, the early pulse detector enables and early pulse detector disables together with the latch 19 cause the early pulse detector 20 to be enabled for the predetermined period of time following the first pulse.

Each of the early pulse detector enables 15a and 15b includes an inhibit means which inhibits the latch 19 from once again being set once it has been set. Thus, the early pulse detector can only be enabled once for each repetition rate determination. Because the counters 14a and 14b are driven by a free running oscillator 12 and have a finite capacity, a second pulse which arrives so late as to allow the counters to count up to capacity and back to zero will not be detected as an early pulse by the subsequent enabling of the early pulse detector 20. The inhibit means of the early pulse detector enables 15a and 15b are more fully described and shown in relation to FIG. 2.

Late pulse indicators 18a and 18b are coupled to their respective counters 14a and 14b. The late pulse indicators are responsive to their respective counters for providing a late pulse error output at outputs 36 and 37 at the time in which the second pulse is considered late in arriving. The late pulse error output is produced after a time period of allowable tolerance following the time in which the early pulse detector is disabled. In other words, the pulse repetition rate check circuit of the present invention only provides an error signal when the second of two consecutive pulses is early or late with respect to a predetermined repetition time period spaced apart in time after the receipt of the first pulse. Should the second pulse never be received, that is, should the pulse generator coupled to input 11 be inoperative, the late pulse indicators will at periodic intervals produce a late pulse error output, the succession of which indicates that the pulse generator is inoperative. Thus, the pulse repetition rate check circuit of the present invention is capable of determining if the second of two consecutive pulses arrives early, late or never arrives at all.

Counter reset 17a is coupled to counter 14a and to counter 17b for resetting counter 17b during the time in which counter 14a is operatively keeping time. In a similar manner, counter reset 17b is coupled to counter 14b and to counter 14a for resetting counter 14a when counter 14b is operatively counting time. Only one counter is operatively keeping time at any point in time and the other counter must be reset to accommodate the next occurring input pulse at input 11. To assure that the counter which is idle will be in condition for responding to the next pulse, each counter resets the other while it is operatively counting. Each counter is reset by the other at a point in time closely following the receipt of the preceding pulse to assure that the other counter is in condition for accommodating the next pulse upon its receipt. Having two counters which are each reset by the other provides a pulse repetition rate check circuit which has increased resolution over those pulse repetition rate check circuits of the prior art.

Briefly, in operation, upon the receipt of a pulse at input 11, (the first of two consecutive pulses) steering flip-flop 10 will be caused to change state at its output 21 and 23. Assuming for the moment that steering flip-flop 10 was in a previous state to steer the clock pulses of oscillator 12 to counter number 2, the pulse received by the steering flip-flop will cause it to change states at its outputs 21 and 23 such that output 21 will enable steering gate 13a. Thereupon, the clock pulses from oscillator 12 will be transferred to counter 14a from the output 25 of oscillator 12 through steering gate 13a and to counter 14a. Counter 14a will therefore be activated to keep time in response to the pulse received at input 11. At this time, counter 14b will be inactive and will be arrested at its last count upon the receipt of the pulse at input 11.

The leading edge of the input pulse causes counter 14a to begin counting. After a time period equal to the maximum pulse width of the pulse received at input 11, the early pulse detector enable 15a will, in response to the counter 14a, set latch 19. Latch 19 being set will enable early pulse detector 20. Should the second pulse of the two consecutive pulses be received before the early pulse detector 20 is disabled, the early pulse detector will detect the second pulse at input 11 and provide an early pulse error output at output 35. If the second of the two consecutive pulses has not occurred during the time in which the early pulse detector has been disabled, the early pulse detector disable 16a responsive to counter 14a will cause the latch 19 to be reset to thus disable the early pulse detector 20. The early pulse detector will not be enabled again due to the fact that at the time it was enabled the inhibit means within the early pulse detector enable 15a precluded latch 19 from being set after it was once set.

After the early pulse detector is disabled by the early pulse detector disable 16a, there is a period of time referred to herein as the predetermined repetition time period in which, should the second pulse occur, the second pulse will be considered to be on time. If the pulse occurs within this time, the steering flip-flop will direct the clock pulses from oscillator 12 to counter 14b and restart the cycle for monitoring the repetition rate of the next pulse. Therefore, it can be seen that the second of two consecutive pulses is also the first pulse in relation to the pulse which follows it.

Should the second of the two consecutive pulses not occur within the predetermined repetition time period following the first pulse, late pulse indicator 18a at the time that the second pulse is first considered late, will provide responsive to counter 14a a late pulse error output in the form of a pulse from output 36. Should the second pulse occur so late as to cause counter 14a to count up to capacity and back to zero, the inhibit means within the early pulse detector enable 15a will preclude the early pulse detector from being further enabled. Should the second pulse occur so late that the counter 14a counts through its entire cycle, the late pulse indicator 18a will again produce responsive to counter 14a a late pulse error output. If the pulse generator coupled to input 11 is inoperative, thus producing no pulses, late pulse indicator 18a will provide at output 36 a series of pulses at periodic intervals indicating that the pulse generator is inoperative.

Once the pulse generator produces the second of the two consecutive pulses, the steering flip-flop 10 will cause counter 14b to start counting and counter 14a will stop. While counter 14b was sitting idle, counter 14a had reset counter 14b via counter reset 17a. The resetting of counter 14b occurred at the beginning of the predetermined time period in which the early pulse detector 20 was enabled to thereby assure that counter 14b was conditioned to act upon the second of the two consecutive pulses.

After the second of the two consecutive pulses occurred, it would be treated like a first pulse by counter 14b and the cycle would be repeated. The next pulse would therefore activate counter 14a again. As can be seen from the foregoing, the pulse repetition rate check circuit of the present invention checks the repetition rate of two consecutive pulses on a pulse by pulse basis. Because one counter resets the other, one counter is always ready to accommodate the next pulse.

Figure 2:
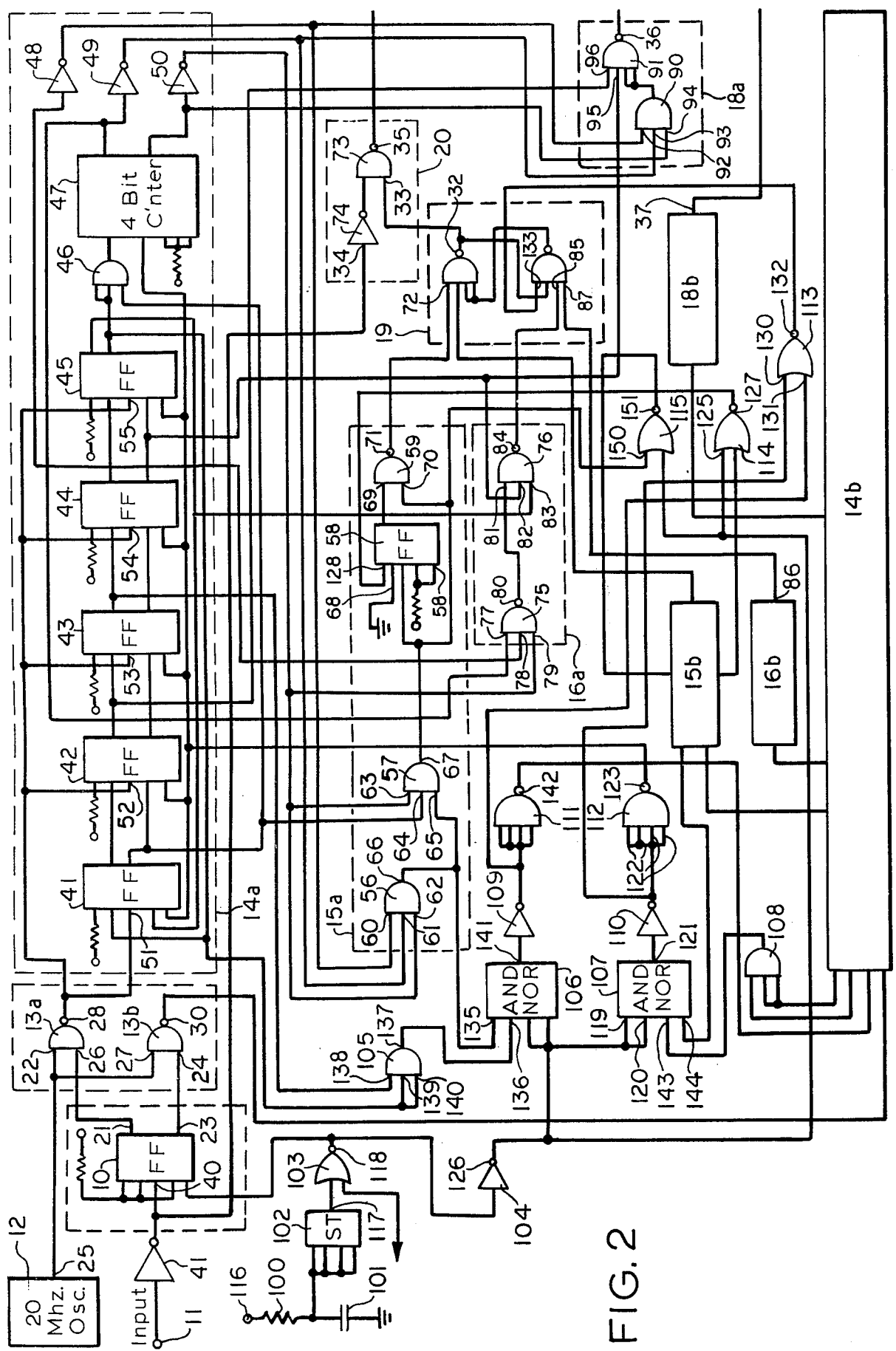
FIG. 2 is a detailed schematic circuit diagram of the pulse repetition rate check circuit of FIG. 1.

Referring now to FIG. 2 and the detailed schematic circuit diagram of the pulse repetition rate check circuit of FIG. 1, input 11 is coupled to clock input 40 of steering J-K flip-flop 10 by inverter 41. Inverter 41 is provided to invert the polarity of the pulses received from the pulse generator which is coupled to input 11. Counter 14a comprises a Johnson counter comprising J-K flip-flops 41, 42, 43, 44 and 45, interface AND gate 46, 4-bit binary counter 47 and inverters 48, 49 and 50. AND gate 46 interfaces the Johnson counter with the 4-bit binary counter 47. Inverters 48, 49 and 50 provide inverted count information to be used by the rest of the pulse repetition rate check circuit. Counter 14b is shown in block form because it is identical in configuration to counter 14a.

Steering gates 13a and 13b have inputs 22 and 27 coupled to oscillator 12 and inputs 26 and 24 coupled to the steering flip-flop 10 as shown and previously described in relation to FIG. 1. Output 28 of steering gate 13a is coupled to the clock inputs 51, 52, 53, 54 and 55 of flip-flops 41, 42, 43, 44 and 45 respectively which comprise the Johnson counter of counter 14a. The Johnson counter is provided because it provides an unambiguous indication of one time increment to the next.

The early pulse detector enable 15a comprises AND gate 56, AND gate 57, J-K flip-flop 58 and NAND gate 59. Flip-flop 58 comprises the inhibit means for the early pulse detector enable 15a. Early pulse detector enable 15b is shown in block form inasmuch as it is identical to the early pulse detector enable 15a except that it is associated with counter 14b instead of counter 14a.

As can be seen from FIG. 2, inputs 60, 61 and 62 of AND gate 56 are coupled to counter 14a. Inputs 63 and 64 of NAND gate 57 are also coupled to counter 14a and input 65 is coupled to output 66 of AND gate 56. Output 67 of AND gate 57 is coupled to clock input 68 of flip-flop 58. The Q output of flip-flop 58 is coupled to input 69 of NAND gate 59 and input 70 of NAND gate 59 is coupled to output 67 of AND gate 57. Output 71 of NAND gate 59 is coupled to input 72 of latch 19. Output 32 of latch 19 is coupled to input 33 of the early pulse detector NAND gate 73. Inverter 74 of early pulse detector 20 has input 34 coupled to the output of inverter 41 which is coupled to input 11 for providing early pulse detector 20 with the pulses received from the pulse generator which is coupled to input 11.

Early pulse detector disable 16a comprises NAND gate 75 and NAND gate 76. NAND gate 75 has inputs 77, 78 and 79 coupled to clock 14a. Output 80 of NAND gate 75 is coupled to input 81 of NAND gate 76. Inputs 82 and 83 of NAND gate 76 are coupled to counter 14a. Output 84 of NAND gate 76 is coupled to input 85 of latch 19 for resetting the latch.

Early pulse detector disable 16b is shown in block form inasmuch as its configuration is identical to the configuration of early pulse detector disable 16a but is associated with counter 14b instead of counter 14a. Its output 86 is coupled to input 87 of latch 19 for resetting latch 19 responsive to counter 14b.

Late pulse detector or indicator 18a comprises AND gate 90 and NAND gate 91. Inputs 92, 93, and 94 of AND gate 90 are coupled to clock 14a and input 95 of NAND gate 91 is coupled to clock 14a. They are coupled to appropriate outputs of the counter 14a so as to provide an indicating pulse at output 36 at the time that the second of the two consecutive pulses is first considered late.

Late pulse detector or indicator 18b is shown in block form inasmuch as it is identical in configuration to late pulse indicator 18a. Late pulse indicator 18b is coupled to counter 14b and provides at output 37 a late indicative pulse when the second of the two consecutive pulses is late when counter 14b is being utilized.

The pulse repetition rate check circuit of FIG. 2 additionally includes a power on and reset circuit which is utilized to clear all of the flip-flops of the circuit except for the inhibit flip-flops which are preset in the early pulse detector enabling means when power is first applied to the circuit. The power on and reset circuit comprises resistor 100, capacitor 101, Schmitt trigger 102, NOR gate 103, inverter 104, AND gate 105, AND-NOR gate 106, AND-NOR gate 107, AND gate 108, inverter 109, inverter 110, NAND gate 111, NAND gate 112, NOR gate 113, NOR gate 114, and NOR gate 115.

The power on circuit clears the counter flip-flops in the following manner. When power is first applied to terminal 116 of resistor 110, Schmitt trigger 102 will provide a logical one output at output 117 causing a logical zero at output 118 of NOR gate 103. The logical zero at output 118 is inverted by inverter 104 and applied to inputs 119 and 120 of AND-NOR gate 107 for clearing the flip-flops of counter 14a. The logical ones at inputs 119 and 120 of AND-NOR gate 107 causes a logical zero at output 121 which is inverted by inverter 110 and applied to the input 122 of NAND gate 112. This results in output 123 of NAND gate 112 being a logical zero. Output 123 is coupled to all of the clear inputs 51–55 of flip-flops 41–45 respectively and to the clear input 88 of the 4-bit binary counter 47. Logical zero at these clear inputs clears each of the flip-flops. The clearing of the flip-flops of counter 14b is initiated at AND-NOR gate 106 in identical fashion to that previously described for counter 14a.

The inhibit flip-flop 58 is preset by NOR gate 114. Input 125 of NOR gate 114 is coupled to output 126 of inverter 104. The logical one at output 126 during power on results in a logical zero output at output 127 of NOR gate 114. Output 127 is coupled to preset input 128 of flip-flop 58 to preset it. The flip-flop of the inhibit means within the early pulse detector 15b is preset in identical manner by NOR gate 115.

NOR gate 113 sets latch 19 into the proper condition upon the application of the initial power. NOR gate 113 has inputs 130 and 131 coupled to the outputs of inverters 109 and 110 respectively and provides at output 132 a logical zero responsive to the logical ones produced at the outputs of inverters 109 and 110 during the initial power application. The logical zero at output 132 is impressed upon input 133 of NAND gate 85 of latch 19 to preset it to the proper condition.

Inputs 135 and 136 of AND-NOR gate 106 are utilized for resetting counter 14b responsive to counter 14a. Input 136 is coupled to output 137 of AND gate 105 which has its inputs 138, 139 and 140 coupled to counter 14a. Input 135 is coupled to output 66 of AND gate 56 which has its inputs 60, 61 and 62 also coupled to counter 14a. When counter 14a is counting, at an appropriate time determined by the counter outputs to which the inputs of AND gates 105 and 56 are coupled will cause logical ones to appear at inputs 135 and 136 of AND-NOR gate 106. This produces a logical zero at output 141 of AND-NOR gate 106 which is inverted by inverter 109 to result in a logical zero at output 142 of NAND gate 111. Output 142 is coupled to the clear inputs of all of the flip-flops and the 4-bit binary counter which comprises counter 14b and the logical zero at output 142 will clear counter 14b. Counter 14a is cleared responsive to counter 14b in an identical manner by utilizing inputs 143 and 144 of AND-NOR gate 107.

In operation, and referring to FIG. 3 which shows a graphical representation of the various waveforms generated by the pulse repetition rate check circuit of FIG. 2, waveform a shows two consecutive pulses 150 and 151 which are nominally spaced apart in time, $t_r$, the nominal repetition time. The pulse width of pulse 151 as shown in FIG. 3 is the maximum pulse width $t_w$, which is defined by the time period beginning at $t_1$ and ending at $t_2$.

Assuming that pulse 151 is the first of two consecutive pulses, and assuming that counter 14a will be activated responsive to pulse 151, the operation of the pulse repetition rate check circuit of FIG. 2 will be herein described.

When pulse 151 is first received at $t_1$, steering flip-flop 10 will provide at output 21 a logical one to cause the clock signals from oscillator 12 to be gated by NAND gate 13a to counter 14a to cause counter 14a to begin counting. After a predetermined period of time equal to the maximum pulse width ($t_w$) of pulse 151, at $t_2$ the early pulse detector enable will provide a negative going pulse (waveform b) which begins at $t_2$ and terminates at $t_3$. At $t_2$, inputs 60, 61, 62, 63 and 64 are all coupled to appropriate counter outputs to receive logical ones. Therefore a logical one will appear at output 66 of AND gate 56 which is impressed upon input 65 of AND gate 57. Input 63 and 64 of AND gate 57 also being a logical one will provide a logical one at output 67 which is impressed upon input 70 of NAND gate 59. Because flip-flop 58 has been preset, it will provide at input 69 of NAND gate a logical one. The logical one at input 69 and the logical one at inputs 70 of NAND gate 59 will cause a logical zero at output 71 which is impressed upon input 72 of latch 19 causing the latch to provide at output 32 a logical one. This is graphically illustrated in waveform d. It enables the early pulse detector 20 comprising inverter 74 and NAND gate 73 to detect the second of the two consecutive pulses should it occur early.

Output 67 of AND gate 57 is also coupled to the clock input 68 of flip-flop 58. The trailing edge at time $t_3$ of output 67 of AND gate 57 will toggle flip-flop 58 causing its output coupled to input 69 of NAND gate 59 to change state to logical zero to thus inhibit the further setting of latch 19. The waveform appearing at input 69 of NAND gate 59 is shown in waveform $f$ of FIG. 3.

With the early pulse detector 20 being enabled, any second pulse occuring before time $t_4$ will be detected and will be indicated by an output pulse out of output 35 of NAND gate 73. As shown in FIG. 3, the time interval between $t_4$ and $t_6$ is referred to as the allowable tolerance, or in other words, the predetermined repetition time period following the first pulse 151. Any pulse appearing after time $t_4$ is either on time or late. Therefore, at time $t_4$ the early pulse detector must be disabled. This is accomplished by the early pulse disable 16a. Inputs 77, 78, 79, 82 and 83 are all coupled to counter 14a and at time $t_4$ will cause output 84 of NAND gate 76 to produce a negative pulse shown in waveform c to disable the early pulse detector 20. The negative going disable pulse occurring at time $t_4$ resets latch 19 as shown in waveform d. Any pulse occurring after time $t_4$ will therefore not be detected as an early pulse.

Should the second pulse following pulse 151 not occur between time $t_2$ and $t_6$, at time $t_6$ the late pulse indicator 18a will provide an output at output 36 indicating that the pulse is late. Inputs 92, 93 and 94 of AND gate 90 and inputs 95 and 96 of NAND gate 91 are all coupled to counter 14a. At time $t_6$ they will receive from counter 14a appropriate logic level inputs to provide at output 36 a positive going pulse indicating that the second of the two consecutive pulses is late (waveform $e$).

Should the second of the two consecutive pulses occur so late as to allow the counter 14a to count up to capacity and back to zero, even though the counter cycle has started again, the early pulse detector will not be enabled because of the logical zero at input 69 of NAND gate 59 provided by the inhibit flip-flop 58. Therefore, a second pulse which is so late as to cause the counter to count to capacity and back to zero will not be inadvertently detected as an early pulse.

When the second of the two consecutive pulses is received, the steering flip-flop 10 will cause counter 14b to begin counting so that the repetition time between the second pulse and the pulse which immediately comes after it can be monitored. Should a pulse be received on time, between times $t_4$ and $t_6$, there will be no early pulse indication nor a late pulse indication and one counter will stop counting and the other counter will be activated to begin counting.

Lastly, the inhibit means of one early pulse detector enabling means removes the inhibit from the other inhibit means. Output 67 of AND gate 57 is also coupled to input 150 of NOR gate 115. As previously described, output 151 of NOR gate 115 is coupled to the preset input of the inhibit flip-flop of the early pulse detector enabling means 15b. When the early pulse detector 20 is enabled by output 67, the output at output 67 additionally causes NOR gate 115 a negative pulse to preset the inhibit flip-flop of early pulse detector enabling means 15b to condition it when its counter 14b is once again utilized upon the receipt of the next pulse. Inhibit flip-flop 58 of early pulse detector enabler 15a is preset by the early pulse detector enable 15b in the identical manner. Therefore, each inhibit means is ready to act upon the next pulse upon its receipt.

The present invention therefore provides a pulse repetition rate check circuit which can monitor the pulse repetition rate of a train of pulses on a pulse to pulse basis. Because the pulse repetition rate check circuit of the present invention includes two counters which reset each other, and which are operative on alternate pulses, the repetition rate check circuit of the present invention has sufficient resolution to monitor the repetition rate of very rapidly reoccurring pulses. Additionally, because the pulse repetition rate check circuit of the present invention includes an inhibit means to inhibit the enabling of the early pulse detector after it has once been enabled, it is assured that a late pulse will not be detected as an early pulse.

While a particular embodiment of the present invention has been shown and described, modifications may be made, and it is intended to cover all such modifications in the appended claims as may fall within the true spirit and scope of the invention.

We claim:

1. A pulse repetition rate check circuit of the type which detects when the second of two consecutive pulses from a pulse generator is early or late with respect to a predetermined repetition time period following the first pulse, said pulse repetition rate check circuit comprising:

an input for receiving the consecutive pulses;
a first clock coupled to said input and activated responsive to the receipt of the first pulse, said clock having a finite capacity before returning to zero time;
an early pulse detector coupled to said input for detecting the second pulse; and
a first early pulse detector enabling means coupled to said clock and to said detector for enabling said detector for a predetermined time and including an inhibit means for preventing said detector from being enabled after said detector has been once enabled; whereby,
said inhibit means will preclude said detector from once again being enabled notwithstanding a second pulse being received so late as to allow said first clock to time up to capacity and back to zero, to thereby prevent a late second pulse from being detected as an early pulse.

2. A pulse repetition rate check circuit in accordance with claim 1 wherein said clock comprises a first counter and an oscillator for clocking said first counter.

3. A pulse repetition rate check circuit in accordance with claim 1 further comprising a first late pulse indicating means coupled to said first clock for providing a late pulse indicative signal when the second pulse is not received within said predetermined repetition time period.

4. A pulse repetition rate check circuit in accordance with claim 1 further comprising a latch coupled to said early pulse detector, wherein said early pulse detector enabling means comprises a gate coupled to said latch for setting said latch to enable said detector and wherein said inhibit means comprises a flip-flop, said flip-flop being coupled to said gate for precluding said gate from setting said latch after said latch has once been set.

5. A pulse repetition rate check circuit in accordance with claim 1 further comprising a second clock activated in response to every other received pulse and a second early pulse detector enabling means coupled to said second clock and to said early pulse detector and including a second inhibit means, whereby said first clock and its associated first early pulse detector enabling means and said second clock and its associated second early pulse detector enabling means are alternately utilized in response to every other received pulse.

6. A pulse repetition rate check circuit in accordance with claim 5 further comprising an oscillator and wherein said first clock comprises a first counter and said second clock comprises a second counter, said first and second counters being coupled to said oscillator for being clocked by said oscillator.

7. A pulse repetition rate check circuit in accordance with claim 6 further comprising a steering circuit coupled to said input and to said first counter and to said second counter for alternately directing the clock signals from said oscillator to said first and second counters responsive to every other received pulse.

8. A pulse repetition rate check circuit in accordance with claim 7 further comprising first counter reset means and second counter reset means, said first counter reset means being coupled to said second counter and to said first counter for resetting said first counter responsive to said second counter, and said second counter reset means being coupled to said first counter and to said second counter for resetting said second counter responsive to said first counter.

9. A pulse repetition rate check circuit in accordance with claim 8 wherein said first and second counters are reset by said first and second counter reset means respectively during said predetermined time whereby, while one of said counters is being utilized for counting time the other said counter is in ready condition for activation upon the receipt of the next pulse.

10. A pulse repetition rate check circuit in accordance with claim 5 further comprising a second late pulse indicating means coupled to said second clock for providing a late indicative signal when the second pulse is not received within said predetermined repetition time period.

* * * * *